United States Patent
Fahrig et al.

(10) Patent No.: US 6,812,700 B2
(45) Date of Patent: Nov. 2, 2004

(54) CORRECTION OF LOCAL FIELD INHOMOGENEITY IN MAGNETIC RESONANCE IMAGING APPARATUS

(75) Inventors: Rebecca Fahrig, Palo Alto, CA (US); Norbert J. Pelc, Los Altos, CA (US); Steven Conolly, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 10/213,149

(22) Filed: Aug. 5, 2002

(65) Prior Publication Data

US 2004/0021464 A1 Feb. 5, 2004

(51) Int. Cl.[7] ............................ G01V 3/00; A61B 5/055; H01J 35/50
(52) U.S. Cl. ................... 324/318; 378/63; 600/410; 600/411; 600/424; 324/309; 324/307
(58) Field of Search ..................... 600/411, 424, 600/410, 409; 324/300–322, 207, 307, 309; 378/63; 342/448

(56) References Cited

U.S. PATENT DOCUMENTS

| | | | | |
|---|---|---|---|---|
| 4,595,899 A | | 6/1986 | Smith et al. | |
| 5,558,091 A | * | 9/1996 | Acker et al. | 600/424 |
| 5,713,357 A | * | 2/1998 | Meulenbrugge et al. | 600/411 |
| 5,807,254 A | * | 9/1998 | Meulenbrugge et al. | 378/63 |
| 6,101,239 A | * | 8/2000 | Kawasaki et al. | 378/63 |
| 6,198,957 B1 | * | 3/2001 | Green | 600/411 |
| 6,208,884 B1 | * | 3/2001 | Kumar et al. | 600/409 |
| 6,366,798 B2 | * | 4/2002 | Green | 600/411 |
| 6,593,884 B1 | * | 7/2003 | Gilboa et al. | 342/448 |
| 6,658,085 B2 | * | 12/2003 | Sklebitz | 378/63 |
| 2001/0001807 A1 | * | 5/2001 | Green | 600/411 |
| 2003/0103597 A1 | * | 6/2003 | Sklebitz | 378/63 |
| 2003/0123612 A1 | * | 7/2003 | Pelc et al. | 378/137 |

\* cited by examiner

*Primary Examiner*—Diego Gutierrez
*Assistant Examiner*—Tiffany A. Fetzner
(74) *Attorney, Agent, or Firm*—Beyer Weaver & Thomas LLP

(57) ABSTRACT

Perturbations in a static magnetic field of magnetic resonance imaging apparatus are compensated by creating magnetic fields near an object creating the perturbations with the magnetic fields adjusted to offset the perturbations in the static magnetic field. In an embodiment where the perturbations are caused by an x-ray detector in a combined modality imaging apparatus, the coils are positioned to surround the x-ray detector and create magnetic fields in the static magnetic field outside of the detector which compensate for the perturbations caused by the x-ray detector.

10 Claims, 3 Drawing Sheets

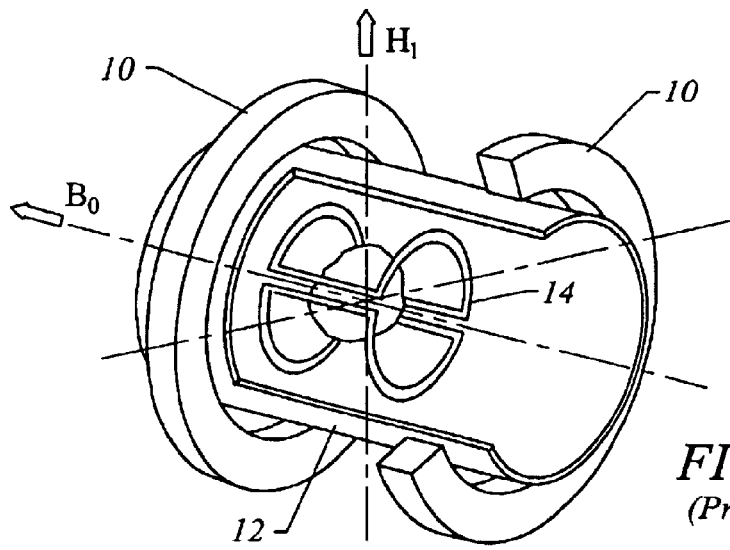
FIG. 1A
(Prior Art)
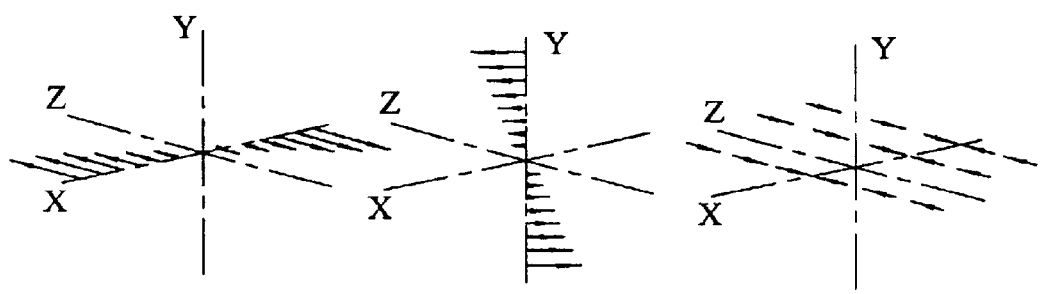
FIG. 1B
(Prior Art)
FIG. 1C
(Prior Art)
FIG. 1D
(Prior Art)
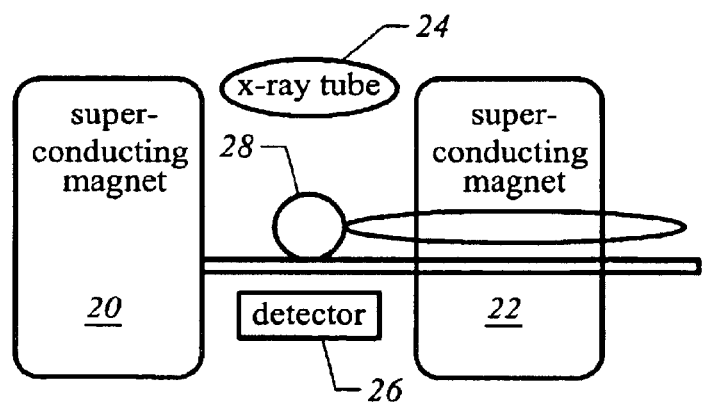
FIG. 2

(1) X-Ray System Affects MR
B₀ inhomogeneity due to detector signal drop-out seen
in MR images
detector is lowered by
30 cm during MR
MR to x-ray = 30 s
X-ray to MR = 4 min
phase map images
acquired with and without
detector in position

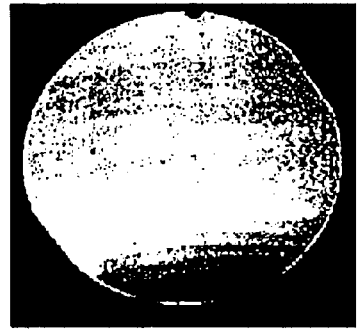

*FIG. 3*

(1) X-Ray System Affects MR
B₀ inhomogeneity due to detector

Baseline ~ 2ppm          detector within 8 cm of table

  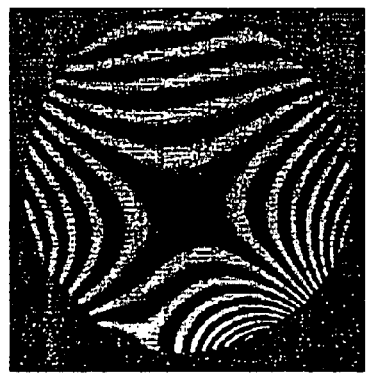

Overall decrease in homogeneity of 16 ppm
TR/TE = 150/20, $256^2$, 1 cm thk, +/-16kHz, 30x30 cm, 50 Hz/cycle

(1) X-Ray System Affects MR
B$_0$ inhomogeneity: local shim coils

CORRECTION OF LOCAL FIELD INHOMOGENEITY IN MAGNETIC RESONANCE IMAGING APPARATUS

The U.S. government has rights in the disclosed invention pursuant to NIH contract no. RR09784 with Stanford University.

CROSS-REFERENCES TO RELATED APPLICATIONS

BACKGROUND OF THE INVENTION

This invention relates generally to magnetic resonance imaging (MR), and more particularly, the invention relates to correction of local field inhomogeneity in MR apparatus.

FIG. 1A is a perspective view partially in section illustrating coil apparatus in an MR imaging system, and FIGS. 1B–1D illustrate field gradients which can be produced in the apparatus of FIG. 1A In operation, a uniform static field $B_0$ is generated by the magnet comprising the coil pair 10. A gradient $G_x$ is generated by a complex gradient coil set which can be wound onto cylinder 12. An RF field $B_1$ is generated by a saddle coil 14. A patient undergoing imaging would be positioned along the Z axis within saddle coil 14. In FIG. 1B an x-gradient field is shown which is parallel to the static field $B_0$ and varies linearly with distance along the x axis that does not vary with distance along the y and z axes. FIGS. 1C and 1D are similar representations of the y gradient and z gradient fields, respectively.

Conventionally, MR apparatus includes shim coils to correct main field, $B_0$, inhomogeneity due to manufacturing tolerances and the like which can disturb the field. It is also known to provide external coils around the MR coils to counteract fields external to the MR apparatus. See U.S. Pat. No. 4,595,899, for example. These prior art shim coils are generally placed around the entire imaging volume.

The role of imaging in medicine has recently expanded, with increased emphasis on imaging during interventional procedures, combined modality imaging (i.e., x-ray and MR simultaneously), and increased patient monitoring during imaging, as illustrated in FIG. 2. Here, two superconducting magnets 20, 22 are coaxially aligned but spaced apart to accommodate an x-ray tube 24 and detector 26 for imaging an object (patient) 28. A problem has heretofore been recognized stemming from magnetic field of the MR apparatus disturbing the x-ray tube at operation. U.S. Pat. No. 4,595,899 addresses this problem by positioning the x-ray tube at a distance from the MR device at an area where the static magnetic stray field is weak enough to be shielded without distorting the static field in the MR device.

A problem has been recognized by applicants herein due to the presence of the x-ray detector in close proximity to the static magnetic field and resulting in an inhomogeneity in the static magnetic field near the detector which can adversely affect MR imaging. The problem can similarly occur with other components placed within or near to the imaging volume. The present invention is directed to overcoming this problem.

BRIEF SUMMARY OF THE INVENTION

In accordance with the invention, an object in close proximity to MR apparatus and causing perturbations in the static magnetic field is provided with magnetic coils which can offset the perturbations in the magnetic field outside of the object. Thus, the effect of any magnetic material in the object, or any magnetic field generated by the object which can distort the main magnetic field is offset with compensating coils. In contrast to prior art methods that place shim coils around the entire imaging volume, the coils of the present invention are purposely positioned near the object causing the magnetic field inhomogeneity.

In a specific embodiment, an x-ray detector placed in the bore of an MR system is provided with a plurality of magnetic coils surrounding the detector. Appropriate current is applied through the coils to correct main field inhomogeneity caused by the detector.

The invention and objects and features thereof will be more readily apparent from the following detailed description and appended claims when taken with the drawings.

BRIEF DESCRIPTION OF THE DRAWINGS

FIGS. 1A–1D illustrate the arrangement of conventional MR apparatus and magnetic fields generated therein.

FIG. 2 is a schematic representation of an MR system with an x-ray tube and detector integrated therewith.

FIG. 3 is a sectional image of a water phantom illustrating magnetic field inhomogeneity due to the presence of an x-ray detector.

FIGS. 4A, 4B illustrate decrease in magnetic field homogeneity from baseline level (2 ppm) to 16 ppm due to the presence of a detector.

DETAILED DESCRIPTION OF THE INVENTION

Figure 5:
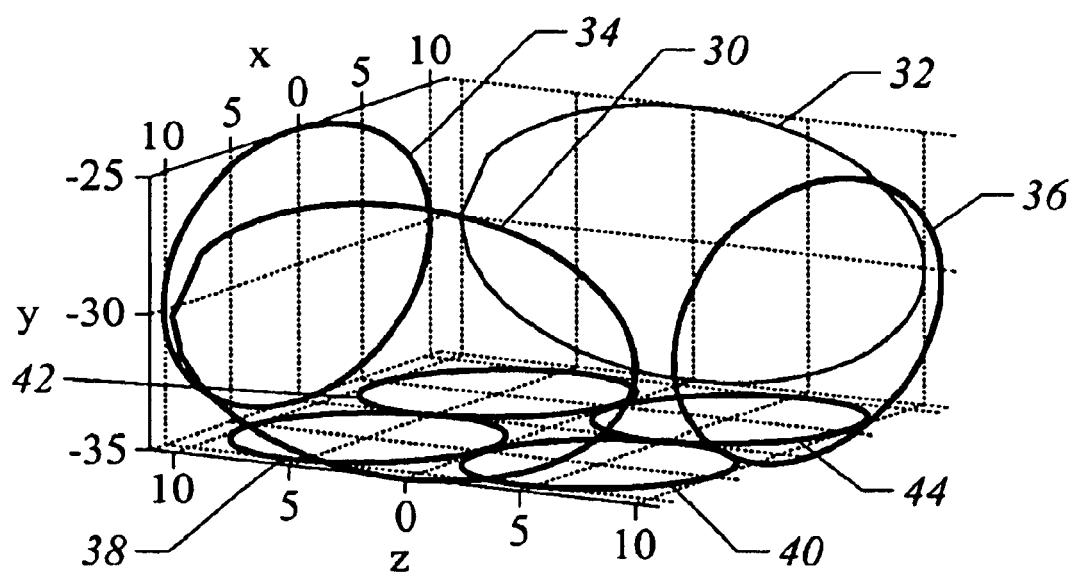
FIG. 5 illustrates coil geometry for surrounding an x-ray detector and compensating for main field inhomogeneity caused by the detector.

The invention has been implemented in a GE Signa SP Magnet System, with an x-ray tube 24 and a flat panel x-ray detector 26 positioned in the bore of the interventional magnet system, as illustrated in FIG. 2. FIG. 3 is a section view of a water phantom imaged in the system with the loss of signal in the lower portion of the image demonstrating $B_0$ inhomogeneity. More particularly, FIGS. 4A and 4B show the "in-phase" portions of MR images of the phantom collected without and with the detector in place, respectively. FIG. 4B was collected after readily employed linear shimming. Oscillations in these images reflect variations in magnetic field strength. The level of homogeneity computed from FIG. 4A indicates that, in the baseline condition, the $B_0$ main field had only a two parts per million (ppm) inhomogeneity, while derived from FIG. 4B, a decrease in homogeneity to 16 ppm occurs with the x-ray detector within 8 cm of the patient table in FIG. 2.

In accordance with the invention, compensating coils surrounding the x-ray detector can offset most of the distortion in the $B_0$ field caused by the presence of the detector. FIG. 5 illustrates the positioning of eight coils around the detector, including two opposing coils 30, 32 on opposite sides of the detector, two opposing coils 34, 36 on opposite ends of a detector, and four coplanar coils 38, 40, 42, 44 adjacent to the bottom surface of the detector. With appropriate currents through the coils, the main field inhomogeneity can be reduced.

The placement of compensating coils around a perturbing object within a MR system reduces inhomogeneity in the local magnetic field outside of the object and improves the quality of MR images. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. In a combined x-ray imaging and magnetic resonance (MRI) imaging apparatus in which MRI magnetic field homogeneity is perturbed by the presence of an X-ray detector, a method of compensating for the MRI magnetic field homogeneity perturbations comprising:
   a) placing at least one compensating field electromagnetic coil around the X-ray detector; and
   b) passing electrical current through the at least one compensating field coil to counteract the perturbations in the homogeneity of the MRI magnetic field as a result of the presence of said x-ray detector.

2. The method as defined by claim 1 wherein a plurality of compensating field electromagnetic coils are used.

3. The method as defined by claim 2 wherein two compensating field electromagnetic coils are placed on opposing sides of the x-ray detector.

4. The method as defined by claim 3 wherein the plurality of compensating field electromagnetic coils includes two coils positioned on two opposing sides of the x-ray detector and two coils positioned on two opposing ends of the x-ray detector.

5. The method as defined by claim 4 wherein the plurality of compensating field electromagnetic coils further includes a plurality of coplanar coils positioned adjacent to the bottom of the x-ray detector.

6. In a magnetic resonance imaging apparatus; having a perturbing x-ray detector which causes perturbations in a static MRI magnetic field of the apparatus, a method of compensating for the perturbations of the static MRI magnetic field outside of the perturbing x-ray detector comprising:
   a) placing compensating electromagnetic coils near the perturbing x-ray detector, said compensating electromagnetic coils altering the static MRI magnetic field beyond the perturbing x-ray detector and
   b) adjusting the magnetic fields produced by the compensating electromagnetic coils to offset said perturbations of said static MRI magnetic field as a result of the presence of said x-ray detector.

7. A combined modality imaging apparatus comprising:
   a) first and second magnets which are axially aligned and spaced apart and which create a static magnetic field used with magnetic resonance imaging
   b) an x-ray imaging apparatus provided between the first and second magnets, said x-ray imaging apparatus including an x-ray detector that causes perturbations in the static magnetic field used with magnetic resonance imaging and produced by the first and second magnets, and
   c) at least one compensating coil substantially adjacent to said x-ray detector and energized to offset perturbations in the static magnetic field caused by the proximity of the x-ray detector to the static magnetic field.

8. The combined modality imaging apparatus as defined by claim 7 and including two compensating coils are placed on opposing sides of the x-ray detector.

9. The combined modality imaging apparatus as defined by claim 8 and including two compensating coils positioned on opposing ends of the x-ray detector.

10. The combined modality imaging apparatus as defined by claim 9 and further including a plurality of coplanar compensating coils positioned adjacent to the bottom of the x-ray detector.

* * * * *